United States Patent
Taira

(10) Patent No.: US 9,762,138 B2
(45) Date of Patent: Sep. 12, 2017

(54) POWER CONVERSION DEVICE

(71) Applicant: Mitsubishi Electric Corporation, Chiyoda-ku, Tokyo (JP)

(72) Inventor: Satoshi Taira, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/395,046

(22) Filed: Dec. 30, 2016

(65) Prior Publication Data

US 2017/0110980 A1    Apr. 20, 2017

Related U.S. Application Data

(62) Division of application No. 15/100,711, filed as application No. PCT/JP2014/050250 on Jan. 9, 2014, now Pat. No. 9,577,547.

(51) Int. Cl.
*H02M 7/04* (2006.01)
*H02M 1/084* (2006.01)
(Continued)

(52) U.S. Cl.
CPC .............. *H02M 7/04* (2013.01); *H02H 7/122* (2013.01); *H02M 1/084* (2013.01);
(Continued)

(58) Field of Classification Search
CPC ........... H02M 7/04; H02M 2001/0009; H02M 1/084; H02M 1/4216; H02P 27/08; H02H 7/122; H05K 7/20209; H05K 7/20909
See application file for complete search history.

(56) References Cited

U.S. PATENT DOCUMENTS 5,072,354 A    12/1991  Katto et al.
5,285,145 A     2/1994  Minowa et al.
(Continued)

FOREIGN PATENT DOCUMENTS

JP    64-023589 A    1/1989
JP    64-064504 A    3/1989
(Continued)

OTHER PUBLICATIONS

International Search Report of PCT/JP2014/050250 dated Apr. 15, 2014 [PCT/ISA/210].

*Primary Examiner* — Jue Zhang
(74) *Attorney, Agent, or Firm* — Sughrue Mion, PLLC; Richard C. Turner

(57) ABSTRACT

A power conversion device converts three-phase AC power into DC power by two-arm PWM modulation control and includes a main circuit that is constituted by a plurality of switching elements that are bridge-connected therein; a voltage-command generation unit that generates a voltage command value for the main circuit; a current detection unit that detects at least one of output currents of the main circuit; a power-factor calculation unit that calculates a power factor on the basis of the output current and the voltage command value; a carrier-signal generation unit that generates a carrier signal of a frequency corresponding to the power factor; and a PWM-signal generation unit 6 that compares the voltage command value and the carrier signal to generate a PWM signal that executes switching control on the switching elements.

15 Claims, 6 Drawing Sheets

(51) Int. Cl.
*H02P 27/08* (2006.01)
*H02M 1/42* (2007.01)
*H05K 7/20* (2006.01)
*H02H 7/122* (2006.01)
*H02M 1/00* (2006.01)

(52) U.S. Cl.
CPC .......... *H02M 1/4216* (2013.01); *H02P 27/08* (2013.01); *H05K 7/20209* (2013.01); *H05K 7/20909* (2013.01); *H02M 2001/0009* (2013.01)

(56) References Cited

U.S. PATENT DOCUMENTS

| | | |
|---|---|---|
| 5,506,765 A | 4/1996 | Nakata et al. |
| 5,627,742 A | 5/1997 | Nakata et al. |
| 5,920,161 A | 7/1999 | Obara et al. |
| 7,642,666 B2 * | 1/2010 | Ichinose ............... F03D 7/0284 290/44 |
| 2003/0053323 A1 | 3/2003 | Kimura et al. |
| 2004/0183498 A1 | 9/2004 | Iwaji et al. |
| 2005/0141157 A1 | 6/2005 | Okayama et al. |
| 2009/0160378 A1 * | 6/2009 | Hwang ................. F24F 11/008 318/400.3 |
| 2010/0091534 A1 * | 4/2010 | Tadano ................ H02M 5/293 363/157 |
| 2013/0214599 A1 | 8/2013 | Taira |

FOREIGN PATENT DOCUMENTS

| | | |
|---|---|---|
| JP | 02-168895 A | 6/1990 |
| JP | 06-233546 A | 8/1994 |
| JP | 07-046855 A | 2/1995 |
| JP | 2003-009509 A | 1/2003 |
| JP | 2008-072818 A | 3/2008 |
| JP | 2010-268551 A | 11/2010 |
| JP | 2012-210012 A | 10/2012 |

* cited by examiner

POWER CONVERSION DEVICE

CROSS REFERENCE TO RELATED APPLICATIONS

This application is a divisional application of U.S. patent application Ser. No. 15/100,711 filed Jun. 1, 2016, which is a National Stage of International Application No. PCT/JP2014/050250, filed Jan. 9, 2014, the contents of which are incorporated herein by reference in their entireties.

FIELD

The present invention relates to a power conversion device.

BACKGROUND

As a pulse width modulation (PWM modulation) method for a power conversion device using a main circuit constituted by six bridge-connected switching elements, it is conventional to us a "two-arm PWM modulation control".

The two-arm PWM modulation control is a method in which the switching control on one phase among three phases is stopped for a certain time period and the switching controls on the other two phases are executed during this time period. With this method, because switching control on one of the phases is not executed, the switching loss can be reduced.

With the two-arm PWM modulation control, with the reduction effect of switching loss being considered, it is most effective to set the time period, during which switching control on one phase is stopped, to be near a peak value of a three-phase input/output current of a main circuit. A technique has been disclosed in which a phase voltage and a line current of any one of phases are detected; a power factor angle is thereby obtained; and on the basis of this power factor angle, PWM signals of respective phases are controlled such that a period during which switching is stopped follows near to the peak of a phase current (for example, Patent Literature 1).

CITATION LIST

Patent Literature

Patent Literature 1: Japanese Patent Application Laid-open No. H7-46855

SUMMARY

Technical Problem

However, in the conventional technique listed above, it is necessary to control the switching stoppage period for the phases of voltage command values according to the obtained power factor angle, thereby making the control operations complicated. Meanwhile, with the two-arm PWM modulation control, the period during which switching control of one phase is stopped is generally set to be within 60° of the peaks of the voltage command values for three phases. In this case, it is necessary to consider a design that is accordance with a power factor that is assumed in advance. However, when the power factor is larger than the assumed power factor, it leads to the device having excessive quality, which may prevent the power conversion device from being fully utilized. When the power factor is lower than the assumed power factor and if the power factor is limited in order to prevent malfunctions due to a state in which the switching loss of the power conversion device becomes larger than the assumed switching loss, the power conversion device cannot be widely used.

The present invention has been achieved to address the above problems, and an objective of the present invention is to provide a highly versatile type of power conversion device that performs power conversion with two-arm PWM modulation control; that can reduce the limitations on the power factor; and that can fully utilize its capabilities regardless of the power factor.

Solution to Problem

In order to solve the problem and achieve the objective, the present invention relates to a power conversion device that converts DC power into three-phase AC power by using two-arm PWM modulation control. The power conversion device includes a main circuit that is constituted by a plurality of switching elements that are bridge-connected therein; a voltage-command generation unit that generates a voltage command value for the main circuit; a current detection unit that detects at least one of output currents of the main circuit; a power-factor calculation unit that calculates a power factor on the basis of the output current and the voltage command value; a carrier-signal generation unit that generates a carrier signal of a frequency corresponding to the power factor; and a PWM-signal generation unit that compares the voltage command value and the carrier signal so as to generate a PWM signal that executes switching control on the switching elements.

Advantageous Effects of Invention

According to the present invention, it is possible to provide a highly versatile power conversion device that performs power conversion by using two-arm PWM modulation control, in which the power conversion device can reduce the limitations on the power factor and can fully utilize its capabilities regardless of the power factor.

DESCRIPTION OF EMBODIMENTS

Exemplary embodiments of a power conversion device according to the present invention will be explained below in detail with reference to the accompanying drawings. The present invention is not limited to the following embodiments.

First Embodiment

Figure 1:
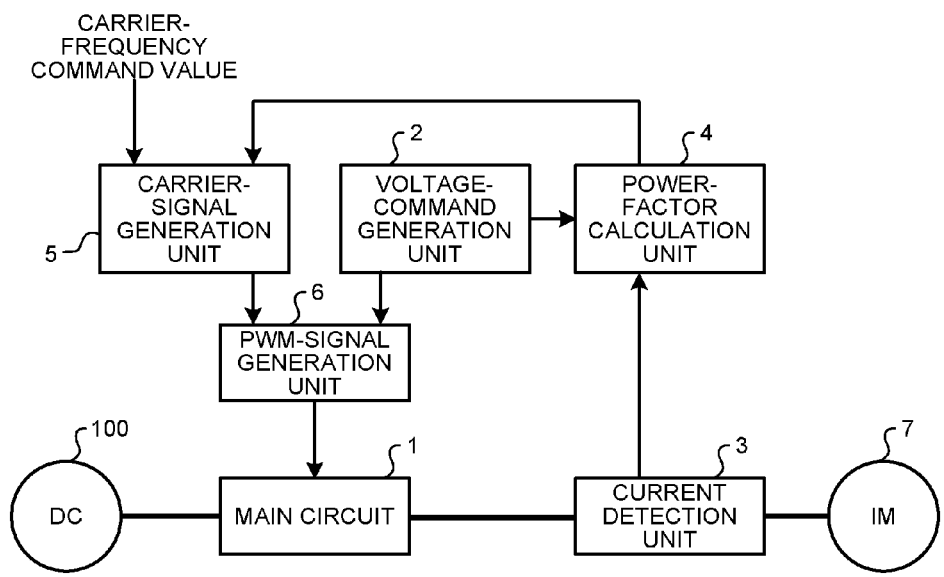
FIG. 1 is a diagram illustrating an example of an inverter device configured as a power conversion device according to a first embodiment.

FIG. 1 is a diagram illustrating an example of an inverter device configured as a power conversion device according to a first embodiment. The example illustrated in FIG. 1 is an example configuration in which direct current (DC) power is supplied from a DC power supply 100 and alternating current (AC) power is supplied to an IM motor that is connected as a load 7.

The power conversion device according to the first embodiment includes a main circuit 1 that is configured to include the arms of three phases that are configured by serially connecting two switching elements (not illustrated) to each other; a voltage-command generation unit 2 that generates voltage command values for three phases with respect to the arms of the respective phases constituting the main circuit 1; a current detection unit 3 that detects the output currents of the arms of the respective phases of the main circuit 1; a power-factor calculation unit 4 that calculates a power factor on the basis of the output currents of the arms of the respective phases of the main circuit 1 and voltage command values for respective phases; a carrier-signal generation unit 5 that generates a carrier signal of a frequency corresponding to a power factor; and a PWM-signal generation unit 6 that compares voltage command values and carrier signals to generate a PWM signal that executes switching control on respective switching elements of the arms of respective phases constituting the main circuit 1. Because the main circuit 1 is a publicly known device, illustrations thereof are omitted here. Further, the current detection unit 3 can be any device as long as it can detect the output current of an arm of at least one phase. The power-factor calculation unit 4 is assumed to perform power factor calculation on the basis of the detected output current and the voltage command value for a phase corresponding to the output current.

Next, an example of control under general two-arm PWM modulation control is described in which switching control on one arm of one phase among the three arms of the three phases is stopped for a certain time period and switching control is executed on the arms of the remaining two phases.

Figure 2:
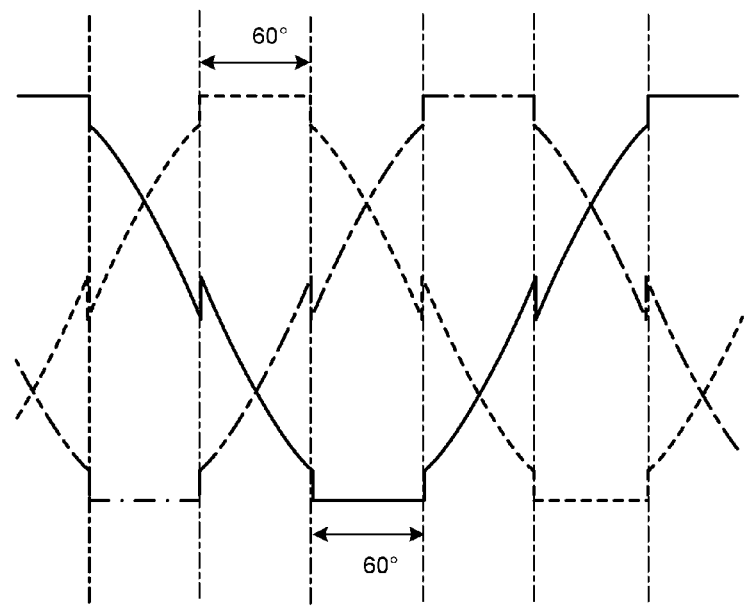
FIG. 2 is a diagram illustrating an example of waveforms of voltage command values for three phases in commonly used two-arm PWM modulation control.
Figure 3:
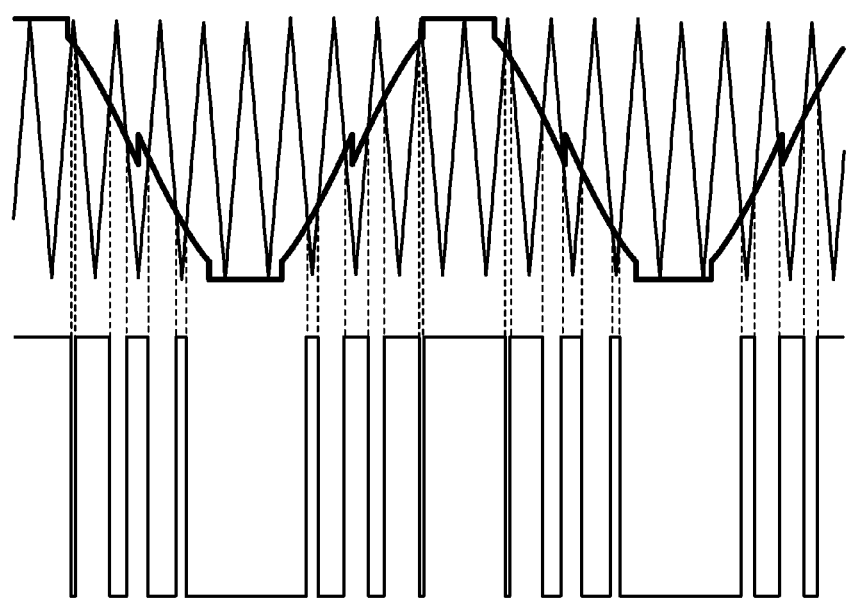
FIG. 3 is a diagram illustrating examples of respective waveforms of a voltage command value, a carrier wave, and an output voltage in commonly used two-arm PWM modulation control.

FIG. 2 is a diagram illustrating an example of the waveforms of voltage command values for three phases under commonly used two-arm PWM modulation control. In FIG. 2, the solid line indicates an example of a waveform of a U-phase voltage command value, the broken line indicates an example of a waveform of a V-phase voltage command value, and the dot-and-chain line indicates an example of a waveform of a W-phase voltage command value. FIG. 3 is a diagram illustrating examples of respective waveforms of a voltage command value, a carrier wave, and an output voltage under commonly used two-arm PWM modulation control.

In the two-arm PWM modulation control, as illustrated in FIG. 2, it is common practice to provide a switching stopping period of 60° across the peaks of respective phase-voltage command values. As illustrated in FIG. 3, as PWM control is executed on respective switching elements of the arms of the respective phases with a PWM signal generated by comparing voltage command values for the respective phases and carrier signals, the switching stopping period of the arms of respective phases is generated while changing the phases every 60°. With this operation, the number of times switching happens can be reduced while maintaining the voltages between phases as sinusoidal. As a result, the switching loss of the power conversion device can be also reduced.

Figure 4:
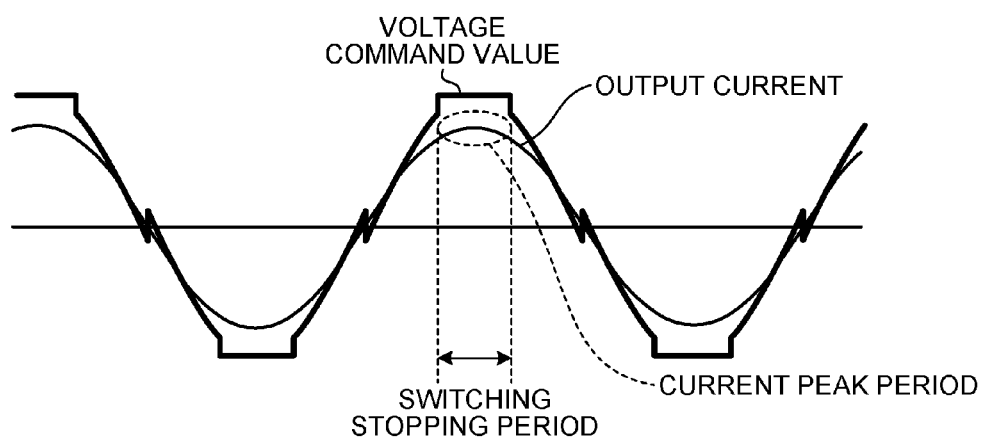
FIG. 4 is a diagram illustrating a relation between a voltage command value and an output current of respective phases in commonly used two-arm PWM modulation control (power factor=1).
Figure 5:
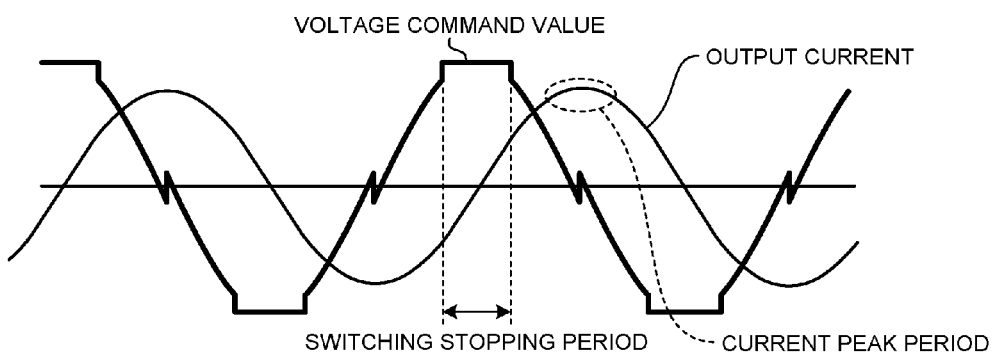
FIG. 5 is a diagram illustrating the relation between a voltage command value and an output current of respective phases in commonly used two-arm PWM modulation control (power factor=0).

The relation between an output current of respective phases and the switching loss of the power conversion device while executing two-arm PWM modulation control is described here. FIGS. 4 and 5 are diagrams illustrating the relation between a voltage command value and an output current of respective phases commonly used in two-arm PWM modulation control. FIG. 4 illustrates an example in which the power factor is 1, and FIG. 5 illustrates an example in which the power factor is 0.

The switching loss is proportional to an instantaneous absolute value of an output current while executing switching, and the switching loss becomes greatest when the switching is executed at the peak of the output current. As illustrated in FIG. 4, when the power factor is 1, i.e., when the phase of the voltage command value and the phase of the output current match each other, the switching stopping period and the peak period of the output current match each other, and the reduction effect of switching loss obtained by the two-arm PWM modulation control is exhibited the most.

Conversely, if the phase of the voltage command value and the phase of the output current shift from each other, shifting occurs between the switching stopping period and the peak period of the output current, and a switching operation is performed during the peak period of the output current. As illustrated in FIG. 5, when the power factor is 0, i.e., when the phase of the voltage command value and the phase of the output current shift from each other by 90°, the reduction effect of switching loss with the two-arm PWM modulation control becomes the most difficult to obtain.

Meanwhile, because the power factor varies depending on the device to be connected as a load, the amount of switching loss also varies depending on the device to be connected as a load. That is, it is necessary to design carrier frequencies, protection against overcurrent, and protection against overheat taking into consideration the device to be connected as a load.

Furthermore, at an actual operation stage, when the power factor becomes smaller than the value assumed at the designing stage, the loss becomes greater, and there is a possibility that the margins of the rated value of the output current and radiation of the switching elements exceeds what they were assumed to be at the designing stage, resulting in malfunctioning of the power conversion device. Therefore, it is necessary to design the power conversion device such that the power factor is set with a limit in advance or such that the margins are set large enough so that the device can withstand such conditions, even if, for example, the power factor is 0. However, if a limitation is set on the power factor, the versatility of the device is lowered; and if the margins are set large, it invites excessive quality when the power factor is large. Therefore, the power conversion device cannot be used to its full capability.

In the present embodiment, when the two-arm PWM modulation control described above is executed, the frequency of carrier signals is changed in accordance with the power factor. When the frequency of carrier signals is high, it is possible to improve the responsiveness on the control operation and to reduce the noise generated from a motor when the load 7 is an electric motor such as an IM motor. However, in this case, the number of switching times increases and thus the switching loss becomes large. When the power factor is small, as described above, the reduction effect of switching loss in the two-arm PWM modulation control becomes less, and as a result, the switching loss becomes large.

Therefore, according to the present embodiment, the power-factor calculation unit 4 obtains the power factor by using an output current detected by the current detection unit 3 and a voltage command value output from the voltage-command generation unit 2; and the carrier-signal generation unit 5, as the power factor obtained by the power-factor calculation unit 4 approaches 0, reduces the frequency of the carrier signals. In this manner, necessary margins are ensured when the power factor is large, and even if the reduction effect of switching loss obtained by the two-arm PWM modulation control is less, it is possible to prevent malfunctions by exceeding the margin.

Furthermore, for example, when a power conversion device designed on the assumption that its power factor is 0 is operated with the power factor of 1, the generation loss becomes less than value it was assumed to be. Therefore, by effectively utilizing the loss margin, as the power factor approaches 1, noise generated by an IM motor that is connected as the load 7 can be reduced by increasing the frequency of the carrier signals.

As described above, according to the power conversion device of the present embodiment, by controlling the frequency of carrier signals corresponding to the power factor, the device can have fewer limitations on the power factor. Therefore, a highly versatile power can be provided that have fewer limitations on the power factor and can fully utilize its capabilities regardless of the power factor.

Note that the setting of the frequency of carrier signals in the carrier-signal generation unit 5 can use either a method of calculating the frequency by a calculation formula such as multiplying the carrier-frequency command value input to the carrier-signal generation unit 5 by a coefficient corresponding to the power factor, or a method of storing a relation between the power factor and the frequency of carrier signals in the form of a table and calculating the frequency corresponding to the power factor by using this table.

Figure 6:
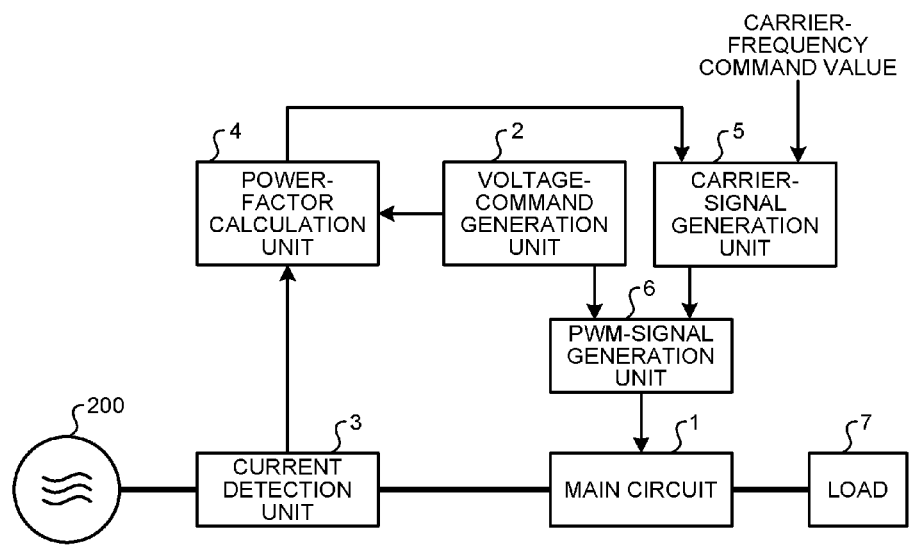
FIG. 6 is a diagram illustrating an example of a converter device configured as the power conversion device according to the first embodiment.

FIG. 6 is a diagram illustrating an example of a converter device configured as the power conversion device according to the first embodiment. The example illustrated in FIG. 6 is an example in which three-phase AC power is supplied from an AC power supply 200 and DC power is supplied to the load 7.

In the example illustrated in FIG. 6, the current detection unit 3 detects the input currents of the arms of the respective phases of the main circuit 1, and the power-factor calculation unit 4 calculates the power factor on the basis of the input currents of the arms of the respective phases of the main circuit 1 and the voltage command values for the respective phases.

Also in the configuration illustrated in FIG. 6, it is taken as being clearly understood that the effects identical to those in the configuration illustrated in FIG. 1 can be achieved by executing the control described in the present embodiment.

As described above, according to the power conversion device of the first embodiment, the frequency of carrier signals is changed depending on the power factor. Therefore, by reducing the frequency of carrier signals as the power factor approaches 0 while maintaining a necessary margin for when the power factor is large, even if the power factor is small and the reduction effect of switching loss obtained by the two-arm PWM modulation control is less, it is possible to prevent a state where the margin is exceeded and malfunctions are caused thereby. Further, when a generation loss is less than an assumed generation loss, by effectively utilizing the loss margin to increase the frequency of carrier signals, the noise generated by an IM motor or the like that is connected as a load can be reduced. That is, by executing control on the frequency of carrier signals corresponding to the power factor, a highly versatile power conversion device can be provided that can relax limitations on the power factor and that can have its capabilities fully utilized regardless of the power factor.

Second Embodiment

The second embodiment of the present invention describes an example in which, when an overcurrent is detected, the current protection level is varied depending on the power factor.

Figure 7:
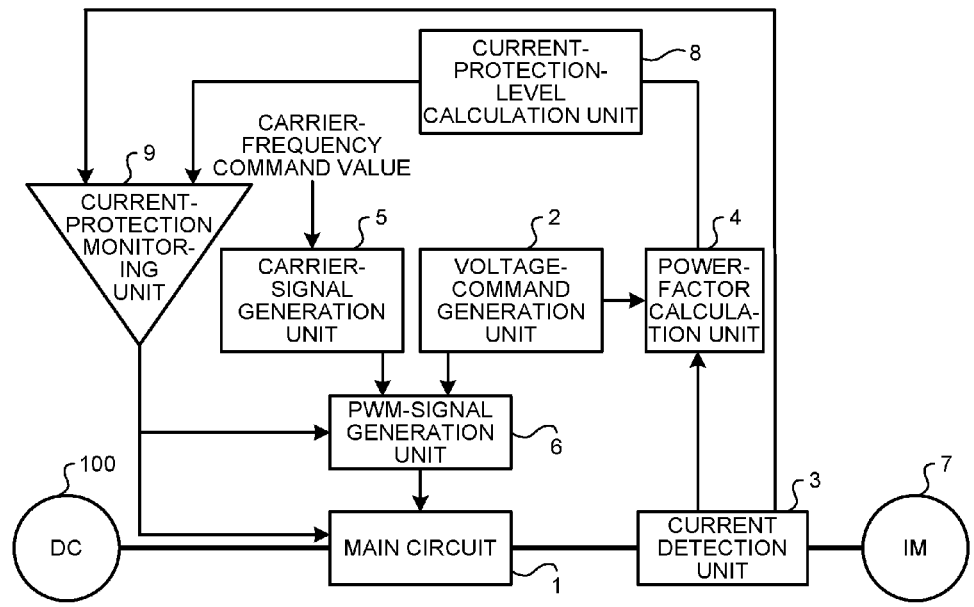
FIG. 7 is a diagram illustrating an example of an inverter device configured as a power conversion device according to a second embodiment.

FIG. 7 is a diagram illustrating an example of an inverter device configured as a power conversion device according to the second embodiment. Also in the example illustrated in FIG. 7, an example configuration is illustrated in which DC power is supplied from the DC power supply 100 and AC power is supplied to an IM motor that is connected as the load 7, which is a similar configuration to that described in the first embodiment and illustrated in FIG. 1. Constituent elements identical or equivalent to the constituent elements described in the first embodiment and illustrated in FIG. 1 are denoted by like reference signs and detailed descriptions thereof will be omitted.

The power conversion device according to the second embodiment further includes, in addition to the constituent elements according to the first embodiment illustrated in FIG. 1, a current-protection-level calculation unit 8 that calculates a current protection level corresponding to the power factor output from the power-factor calculation unit 4; and a current-protection monitoring unit 9 that stops the operation of the main circuit 1 when the output current of the main circuit 1 exceeds a current protection level. The current-protection monitoring unit 9 can employ either a system that, when the operation of the main circuit 1 is stopped, stops the operation of the main circuit 1 by stopping the generation of a PWM signal in the PWM-signal generation unit 6, or, for example, it can employ a system that blocks the supply path of DC power supplied from the DC power supply 100. Alternatively, the current-protection monitoring unit 9 can be a unit that employs these systems in a combined manner.

Next, operations of the power conversion device according to the second embodiment are described. In the present embodiment, an example is also described in which the main circuit 1 is operated by two-arm PWM modulation control.

In the present embodiment, the current protection level is changed depending on the power factor. Specifically, the current-protection-level calculation unit 8, as the power factor obtained by the power-factor calculation unit 4 approaches 0, reduces the current protection level. Alternatively, as the power factor approaches 1, the current protection level is increased.

For example, when a power conversion device that is designed with the assumption that its power factor will be 0 is operated with a power factor of 1, then the devices generation loss becomes less than the value that it was assumed it would be. Therefore, by effectively utilizing the loss margin to increase the current protection level (an overcurrent-protection operating current), the power conversion device can be used where the load 7 is increased.

In this manner, with the power conversion device according to the present embodiment, by executing control on the current protection level corresponding to the power factor, a highly versatile power conversion device can be provided that can relax limitations on the power factor and can have its capabilities fully utilized regardless of the power factor.

Note that the setting of the current protection level in the current-protection-level calculation unit 8 can employ a method of calculating the current protection level using a calculation formula such as multiplying a reference value of the current protection level set in advance by a coefficient corresponding to the power factor, or it can employ a method of using a relation between the power factor and the current protection level in the form of a table and calculating a current protection level corresponding to the power factor using this table.

Figure 8:
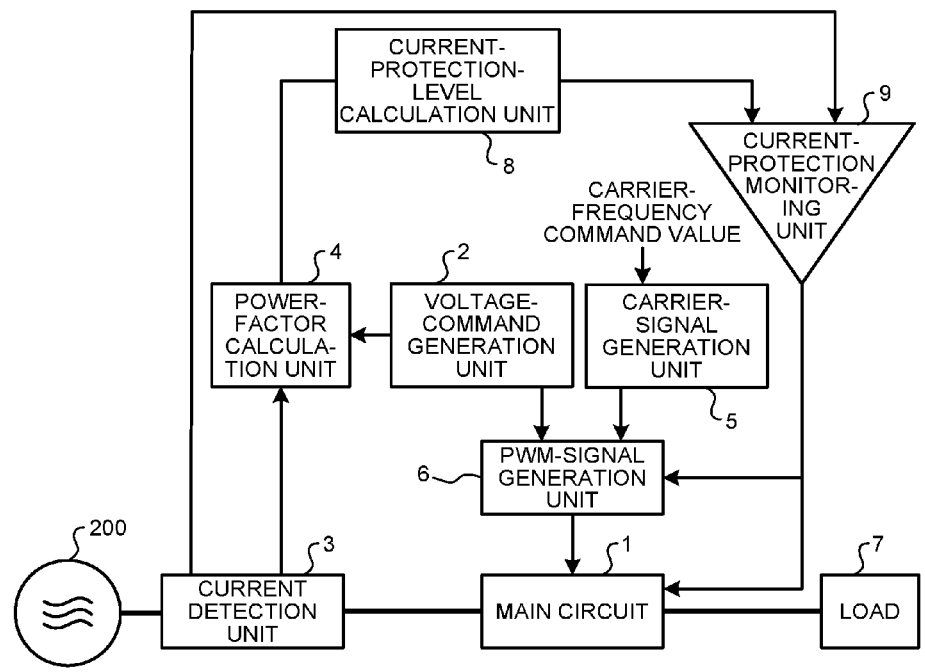
FIG. 8 is a diagram illustrating an example of a converter device configured as the power conversion device according to the second embodiment.

FIG. 8 is a diagram illustrating an example of a converter device configured as the power conversion device according to the second embodiment. In the example illustrated in FIG. 8, an example configuration is illustrated in which three-phase AC power is also supplied from the AC power supply 200 and DC power is supplied to the load 7, which is similar to the configuration described in the first embodiment and illustrated in FIG. 6.

In the example illustrated in FIG. 8, the current detection unit 3 detects input currents of the arms of respective phases of the main circuit 1, and the power-factor calculation unit 4 calculates the power factor on the basis of the input currents of the arms of the respective phases of the main circuit 1 and voltage command values for the respective phases.

Also in the configuration illustrated in FIG. 8, it is clearly understood that effects identical to those in the configuration illustrated in FIG. 7 can be achieved by executing the control described in the present embodiment.

As described above, according to the power conversion device of the second embodiment, because the current protection level is changed depending on the power factor, when the generation loss is less than the value that it is assumed it would be, by effectively utilizing the loss margin to increase the current protection level, the power conversion device can be applied to a larger load. That is, by executing control on the current protection level corresponding to the power factor, a highly versatile power conversion device can be provided that can have fewer limitations on the power factor and that can have its capabilities fully utilized regardless of the power factor.

Third Embodiment

A third embodiment of the present invention describes an example in which the overheat protection level while performing overheat protection according to the power factor is made variable.

Figure 9:
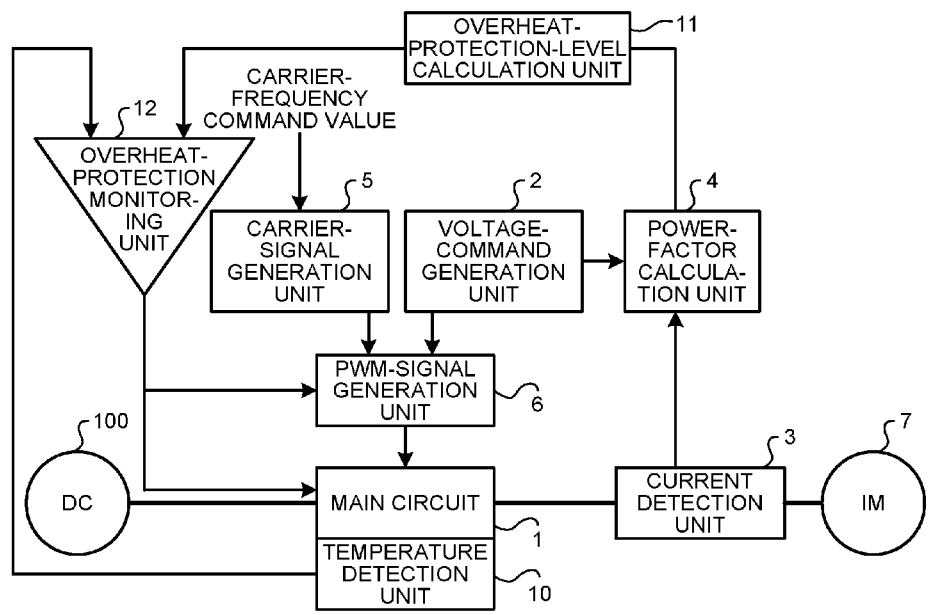
FIG. 9 is a diagram illustrating an example of an inverter device configured as a power conversion device according to a third embodiment.

FIG. 9 is a diagram illustrating an example of an inverter device configured as a power conversion device according to the third embodiment. Also in the example illustrated in FIG. 9, similar to the configuration described in the first embodiment and illustrated in FIG. 1, an example configuration in which DC power is supplied from the DC power supply 100 and AC power is supplied to an IM motor being connected as the load 7 is illustrated. Constituent elements identical or equivalent to those described in the first embodiment and illustrated in FIG. 1 are denoted by like reference signs and detailed descriptions thereof will be omitted.

The power conversion device according to the third embodiment further includes, in addition to the constituent elements according to the first embodiment illustrated in FIG. 1, a temperature detection unit 10 that detects the temperature of the main circuit 1, an overheat-protection-level calculation unit 11 that calculates an overheat protection level corresponding to the power factor output from the power-factor calculation unit 4, and an overheat-protection monitoring unit 12 that stops the operation of the main circuit 1 when the temperature of the main circuit 1 exceeds the overheat protection level. The overheat-protection monitoring unit 12 can employ a system that, when the operation of the main circuit 1 is stopped, stops the operation of the main circuit 1 by stopping generation of a PWM signal in the PWM-signal generation unit 6, and for example, the overheat-protection monitoring unit 12 can employ a system that blocks a supply path of DC power supplied from the DC power supply 100. Alternatively, the overheat-protection monitoring unit 12 can be a unit in which these systems are combined with each other. Further, the temperature detection unit 10 can be, for example, a unit that detects the temperature of a radiator (not illustrated) such as a heat sink attached to the main circuit 1, a unit that detects the surface temperature of the main circuit 1, or a unit that can detect a temperature by which the temperature of a junction (a joint part) of switching elements constituting the main circuit 1.

Next, operations of the power conversion device according to the third embodiment are described. Also in the present embodiment, an example in which the main circuit 1 is operated by two-arm PWM modulation control is described.

The upper-limit value of the junction temperature of switching elements is generally about 150° C., and it is a common practice to provide a temperature margin while operating the main circuit 1 with respect to the upper-limit value. In the present embodiment, in a configuration in which the junction temperature cannot be directly detected, the junction temperature of switching elements is estimated by multiplying a thermal resistance from the temperature detection unit 10 to the junction of the switching elements by a loss of the switching elements and adding the multiplied value to the temperature detected by the temperature detection unit 10.

For example, in the thermal design of the main circuit 1, with respect to the heat generation amount when designing a power conversion device on the assumption that its power factor is 1, when the power conversion device is operated with the power factor 0, because the reduction effect of switching loss obtained by two-arm PWM modulation control becomes less, its generation loss becomes greater than the value that has been assumed, and the actual heat generation amount becomes large. Therefore, it is necessary to lower the overheat protection level (an overheat-protection operating temperature) with respect to the detection temperature in the overheat-protection monitoring unit 12 detected by the temperature detection unit 10.

Therefore, in the present embodiment, the overheat protection level is changed depending on the power factor. Specifically, in the overheat-protection-level calculation unit 11, as the power factor obtained by the power-factor calculation unit 4 approaches 0, the overheat protection level with respect to the detection temperature of the temperature detection unit 10 is reduced. With this configuration, even when the generation loss is greater than the value that has been assumed in advance, the operation of the main circuit 1 can be stopped before the upper-limit value of the junction temperature of switching elements is exceeded, and malfunctions caused by overheat can be prevented beforehand. Alternatively, by increasing the overheat protection level as the power factor approaches 1, the operating temperature range can be widened.

As described above, according to the power conversion device of the present embodiment, by executing control on the overheat protection level corresponding to the power factor, a highly versatile power conversion device that can reduce limitations on the power factor and can effectively utilize its capabilities regardless of the power factor can be provided.

As for the setting of the overheat protection level in the overheat-protection-level calculation unit 11, it is possible to employ a method of calculating the overheat protection level using a calculation formula such as multiplying a reference value of the overheat protection level set in advance by a coefficient corresponding to the power factor, or a method of holding a relation between the power factor and the overheat protection level as a table and deriving an overheat protection level corresponding to the power factor using this table.

Figure 10:
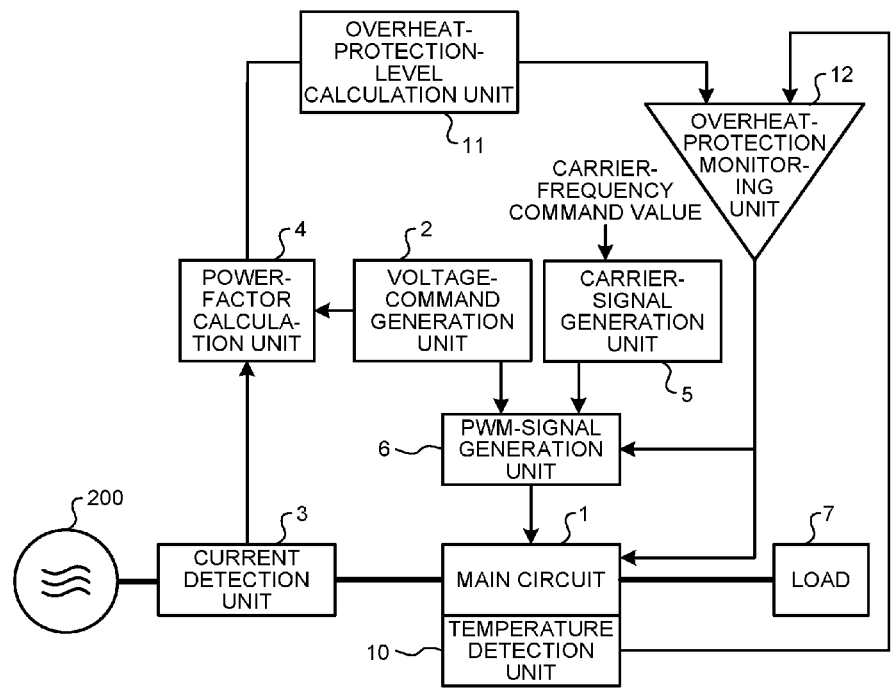
FIG. 10 is a diagram illustrating an example of a converter device configured as a power conversion device according to the third embodiment.

FIG. 10 is a diagram illustrating an example of a converter device configured as the power conversion device according to the third embodiment. Also in the example illustrated in FIG. 10, an example configuration in which AC power is supplied from the AC power supply 200 and DC power is supplied to the load 7 is illustrated, which is similar to the configuration described in the first embodiment and illustrated in FIG. 6.

In the example illustrated in FIG. 10, the current detection unit 3 detects input currents of arms of respective phases of the main circuit 1, and the power-factor calculation unit 4 calculates the power factor on the basis of the input currents of the arms of respective phases of the main circuit 1 and the voltage command values for the respective phases.

Also in the configuration illustrated in FIG. 10, it is clear that the effects identical to those in the configuration illustrated in FIG. 9 can be achieved by executing the control described in the present embodiment.

As described above, according to the power conversion device of the third embodiment, because the overheat protection level with respect to the detection temperature of the temperature detection unit is changed depending on the power factor, when the generation loss is larger than the value that has been assumed, by lowering the overheat protection level, the operation of the main circuit can be stopped before the upper-limit value of the junction temperature of switching elements is exceeded, and malfunctions caused by overheat can be prevented beforehand. That is, by executing control on the overheat protection level corresponding to the power factor, a highly versatile power conversion device that can reduce limitations on the power factor and can effectively utilize its capabilities regardless of the power factor can be provided.

Fourth Embodiment

In the present embodiment, in a configuration having a radiator such as a heat sink provided in a main circuit and including a cooling mechanism such as a fan being capable of varying the cooling capabilities of the radiator, an example is described in which the cooling capabilities of the cooling mechanism are varied depending on the power factor.

Figure 11:
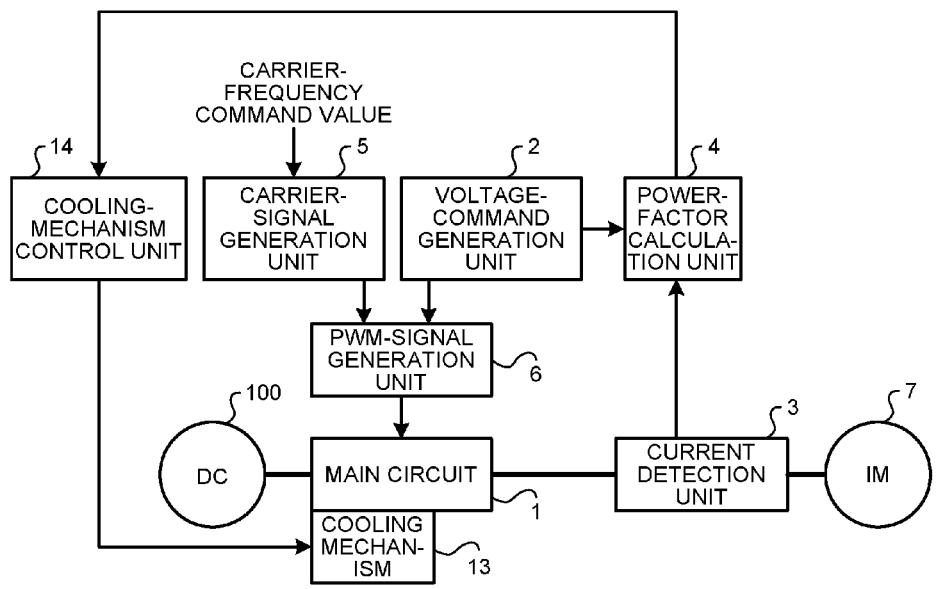
FIG. 11 is a diagram illustrating an example of an inverter device configured as a power conversion device according to a fourth embodiment.

FIG. 11 is a diagram illustrating an example of an inverter device configured as a power conversion device according to the fourth embodiment. Also in the example illustrated in FIG. 11, similar to the configuration described in the first embodiment and illustrated in FIG. 1, an example configuration in which DC power is supplied from the DC power supply 100 and AC power is supplied to an IM motor being connected as the load 7 is illustrated. Constituent elements identical or equivalent to the constituent elements described in the first embodiment and illustrated in FIG. 1 are denoted by like reference signs and detailed descriptions thereof will be omitted.

The power conversion device according to the fourth embodiment further includes, in addition to the constituent elements according to the first embodiment illustrated in FIG. 1, further provided are a cooling mechanism 13 that cools the main circuit 1, and a cooling-mechanism control unit 14 that controls the cooling capabilities of the cooling mechanism 13 in accordance with the value of power factor. As the cooling mechanism 13, a fan or the like being capable of varying the cooling capabilities of a radiator (not illustrated) such as a heat sink attached to the main circuit 1 is assumed; however, the cooling mechanism 13 is not limited thereto, and any device can be considered as long as it is capable of varying the cooling capabilities.

Next, operations of the power conversion device according to the fourth embodiment are described. Also in the present embodiment, an example in which the main circuit 1 is operated by two-arm PWM modulation control is described.

As described in the third embodiment, in the thermal design of the main circuit 1, for example, with respect to the heat generation amount when designing a power conversion device on the assumption that its power factor is 1, when the power conversion device is operated with the power factor 0, because the reduction effect of switching loss obtained by two-arm PWM modulation control becomes less, its generation loss becomes greater than the value that has been assumed, and the actual heat generation amount becomes large. Further, for example, with respect to the heat generation amount when designing a power conversion device on the assumption that its power factor is 0, when the power conversion device is operated with the power factor 1, because the reduction effect of switching loss obtained by two-arm PWM modulation control becomes great, its generation loss becomes less than the value that has been assumed, and the actual heat generation amount becomes less.

While an example, in which the overheat protection level (an overheat-protection operating temperature) with respect to a detection temperature is changed, has been described in the third embodiment; in the present embodiment, the cooling capabilities of the cooling mechanism 13 are changed depending on the power factor. More specifically, in the cooling-mechanism control unit 14, the cooling capabilities of the cooling mechanism 13 are increased as the power factor obtained by the power-factor calculation unit 4 approaches 0. Alternatively, as the power factor approaches 1, the cooling capabilities of the cooling mechanism 13 are lowered. With this configuration, even when the generation loss is larger than the value that has been assumed in advance, as the cooling capabilities of the cooling mechanism 13 are increased, malfunctions of switching elements caused by overheat can be prevented beforehand.

Furthermore, when the generation loss is less than the value that has been assumed in advance, the energy to be consumed by the cooling mechanism 13 can be decreased by lowering the cooling capabilities of the cooling mechanism 13, thereby obtaining energy saving effects.

As described above, according to the power conversion device of the present embodiment, by controlling the cooling capabilities of the cooling mechanism 13 corresponding to the power factor, a highly versatile power conversion device that can reduce limitations on the power factor and can effectively utilize its capabilities regardless of the power factor can be provided.

As for deciding the cooling capabilities of the cooling mechanism 13 in the cooling-mechanism control unit 14, it is possible to employ a method of calculating the cooling capabilities using a calculation formula such as multiplying a reference value of the cooling capabilities set in advance by a coefficient corresponding to the power factor; or to employ a method of holding a relation between the power factor and the cooling capabilities as a table and deriving cooling capabilities corresponding to the power factor using this table.

Next, as an example of the cooling mechanism 13, an example in which a fan being capable of varying the cooling capabilities of a radiator (not illustrated) such as a heat sink attached to the main circuit 1 is included is described.

In this case, as an index of the cooling capabilities of the cooling mechanism 13, it is sufficient that the revolution number of the fan is made variable. More specifically, in the cooling-mechanism control unit 14, as the power factor obtained by the power-factor calculation unit 4 approaches 0, the revolution number of the fan is increased. Alternatively, as the power factor approaches 1, the revolution number of the fan is reduced.

Furthermore, as for deciding the revolution number of the fan in the cooling-mechanism control unit 14, it is possible to employ a method of calculating the revolution number using a calculation formula such as multiplying a reference value of the revolution number of the fan set in advance by a coefficient corresponding to the power factor; or to employ a method of holding a relation between the power factor and the revolution number of the fan as a table and deriving a revolution number of the fan corresponding to the power factor using this table.

Figure 12:
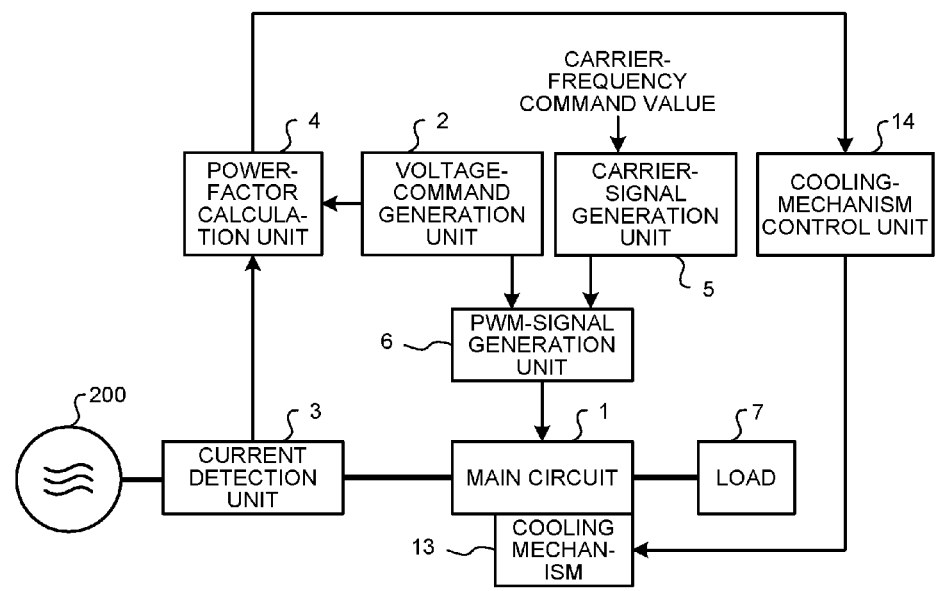
FIG. 12 is a diagram illustrating an example of a convertor device configured as the power conversion device according to the fourth embodiment.

FIG. 12 is a diagram illustrating an example of a converter device configured as the power conversion device according to the fourth embodiment. Also in the example illustrated in FIG. 12, an example configuration in which three-phase AC power is supplied from the AC power supply 200 and DC power is supplied to the load 7 is illustrated, which is similar to the configuration described in the first embodiment and illustrated in FIG. 6.

In the example illustrated in FIG. 12, the current detection unit 3 detects input currents of arms of respective phases of the main circuit 1, and the power-factor calculation unit 4 calculates the power factor on the basis of the input currents of the arms of respective phases of the main circuit 1 and voltage command values for the respective phases.

Also in the configuration illustrated in FIG. 12, it is clear that the effects identical to those in the configuration illustrated in FIG. 11 can be achieved by executing the control described in the present embodiment.

As described above, according to the power conversion device of the fourth embodiment, because the cooling capabilities of the cooling mechanism are changed depending on the power factor, when the generation loss is larger than the value that has been assumed, by increasing the cooling capabilities of the cooling mechanism, malfunctions of switching elements caused by overheat can be prevented. Further, when the generation loss is less than the value that has been assumed in advance, by lowering the capabilities of the cooling mechanism, the energy to be consumed by the cooling mechanism is decreased, thereby obtaining energy saving effects. That is, by executing control on the cooling capabilities of the cooling mechanism corresponding to the power factor, can be provided a highly versatile power conversion device that can reduce limitations on the power factor and that can effectively utilize its capabilities regardless of the power factor.

In the embodiments described above, it has been described that the power-factor calculation unit performs power factor calculation on the basis of a detected current and a voltage command value for a phase corresponding to the detected current; however, it is clear that the power-factor calculation unit can be configured to perform power factor calculation using a current command value generated inside the power conversion device, instead of using a current detected by the current detection unit, or can be configured to perform power factor calculation using an actual measurement value of an output voltage, instead of using a voltage command value.

Further, the configuration described in the above embodiments is only an example of the configuration of the present invention. The configuration can be combined with other publicly-known techniques, and it is clear that the present invention can be configured while modifying it without departing from the scope of the invention, such as omitting a part of the configuration.

INDUSTRIAL APPLICABILITY

As described above, the present invention is useful for a three-phase synchronous electric motor using a permanent magnet for its rotor, and is particularly suitable as a power conversion device that performs power conversion by two-arm PWM modulation control.

REFERENCE SIGNS LIST

1 main circuit, 2 voltage-command generation unit, 3 current detection unit, 4 power-factor calculation unit, 5 carrier-signal generation unit, 6 PWM-signal generation unit, 7 load, 8 current-protection-level calculation unit, 9 current-protection monitoring unit, 10 temperature detection unit, 11 overheat-protection-level calculation unit, 12 overheat-protection monitoring unit, 13 cooling mechanism, 14 cooling-mechanism control unit, 100 DC power supply, 200 AC power supply.

What is claimed is:

1. A power conversion device that converts three-phase AC power into DC power by two-arm PWM modulation control, the power conversion device comprising:
   a main circuit that is constituted by a plurality of switching elements that are bridge-connected therein;
   a voltage-command generation unit that generates a voltage command value for the main circuit;
   a current detection unit that detects at least one of input currents of the main circuit;
   a power-factor calculation unit that calculates a power factor on the basis of the input current and the voltage command value;
   a carrier-signal generation unit that generates a carrier signal of a frequency corresponding to the power factor; and
   a PWM-signal generation unit that compares the voltage command value and the carrier signal so as to generate a PWM signal that executes switching control on the switching elements.

2. A power conversion device that converts three-phase AC power into DC power by two-arm PWM modulation control, the power conversion device comprising:
   a main circuit that is constituted by a plurality of switching elements that are bridge-connected therein;
   a voltage-command generation unit that generates a voltage command value for the main circuit;
   a current detection unit that detects at least one of input currents of the main circuit;
   a power-factor calculation unit that calculates a power factor on the basis of the input current and the voltage command value;
   a carrier-signal generation unit that generates a carrier signal;
   a current-protection-level calculation unit that calculates a current protection level corresponding to the power factor;
   a PWM-signal generation unit that compares the voltage command value and the carrier signal so as to generate a PWM signal that executes switching control on the switching elements; and
   a current-protection monitoring unit that stops an operation of the main circuit when the input current exceeds the current protection level.

3. A power conversion device that converts three-phase AC power into DC power by two-arm PWM modulation control, the power conversion device comprising:
   a main circuit that is constituted by a plurality of switching elements that are bridge-connected therein;
   a temperature detection unit that detects a temperature of the main circuit;
   a voltage-command generation unit that generates a voltage command value for the main circuit;
   a current detection unit that detects at least one of input currents of the main circuit;
   a power-factor calculation unit that calculates a power factor on the basis of the input current and the voltage command value;
   a carrier-signal generation unit that generates a carrier signal;
   an overheat-protection-level calculation unit that calculates an overheat protection level corresponding to the power factor;
   a PWM-signal generation unit that compares the voltage command value and the carrier signal so as to generate a PWM signal that executes switching control on the switching elements; and
   an overheat-protection monitoring unit that stops an operation of the main circuit when the temperature of the main circuit exceeds the overheat protection level.

4. A power conversion device that converts three-phase AC power into DC power by two-arm PWM modulation control, the power conversion device comprising:
   a main circuit that is constituted by a plurality of switching elements that are bridge-connected therein;
   a cooling mechanism that cools the main circuit;
   a voltage-command generation unit that generates a voltage command value for the main circuit;
   a current detection unit that detects at least one of input currents of the main circuit;
   a power-factor calculation unit that calculates a power factor on the basis of the input current and the voltage command value;
   a carrier-signal generation unit that generates a carrier signal;
   a PWM-signal generation unit that compares the voltage command value and the carrier signal so as to generate a PWM signal that executes switching control on the switching elements; and
   a cooling-mechanism control unit that controls cooling capabilities of the cooling mechanism corresponding to the power factor.

5. The power conversion device according to claim 1, wherein
   the carrier-signal generation unit calculates the frequency of the carrier signal on the basis of a relation between the power factor and the frequency of the carrier signal.

6. The power conversion device according to claim 1, wherein
   the carrier-signal generation unit reduces the frequency of the carrier signal as the power factor approaches 0.

7. The power conversion device according to claim 2, wherein
   the current-protection-level calculation unit calculates the current protection level on the basis of a relation between the power factor and current information indicating the current protection level.

8. The power conversion device according to claim 2, wherein
   the current-protection-level calculation unit lowers the current protection level as the power factor approaches 0.

9. The power conversion device according to claim 3, wherein
   the overheat-protection-level calculation unit calculates the overheat protection level on the basis of a relation between the power factor and temperature information indicating the overheat protection level.

10. The power conversion device according to claim 3, wherein
    the overheat-protection-level calculation unit lowers the overheat protection level as the power factor approaches 0.

11. The power conversion device according to claim 4, wherein
    the cooling-mechanism control unit calculates cooling capabilities of the cooling mechanism on the basis of the power factor and electrical quantities indicating the cooling capabilities of the cooling mechanism.

12. The power conversion device according to claim 4, wherein
    the cooling-mechanism control unit increases the cooling capabilities of the cooling mechanism as the power factor approaches 0.

13. The power conversion device according to claim 4, wherein
- the cooling mechanism includes a fan being capable of varying cooling capabilities of a radiator attached to the main circuit, and
- the cooling-mechanism control unit makes a revolution number of the fan variable, as an index of the cooling capabilities of the cooling mechanism.

14. The power conversion device according to claim 13, wherein
- the cooling-mechanism control unit calculates the revolution number of the fan on the basis of a relation between the power factor and the revolution number of the fan.

15. The power conversion device according to claim 13, wherein
- the cooling-mechanism control unit increases the revolution number of the fan as the power factor approaches 0.

* * * * *